US012644933B2

(12) United States Patent  
Schneider et al.

(10) Patent No.: US 12,644,933 B2  
(45) Date of Patent: Jun. 2, 2026

(54) METHOD FOR DETERMINING A STATE OF CHARGE OF AN ELECTRIC ENERGY STORE, ELECTRIC ENERGY STORE, AND DEVICE

(71) Applicant: Robert Bosch GmbH, Stuttgart (DE)

(72) Inventors: Joerg Schneider, Ludwigsburg (DE); Christel Sarfert, Korntal-Muenchingen (DE); Christoph Kroener, Freiberg am Neckar (DE); Ganesh Susmitha, Bengaluru (IN); Holavanahalli Shashank, Stuttgart (DE); Johannes Swoboda, Stuttgart (DE); Johannes Maximilian Nipper, Stuttgart (DE); Olivier Cois, Kernen (DE); Peter Kohn, Stuttgart (DE); Triantafyllos Zafiridis, Heilbronn (DE); Venkatrao Desai, Kalaburagi (IN); Vincent Scharff, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 176 days.

(21) Appl. No.: 18/682,245

(22) PCT Filed: Jun. 1, 2022

(86) PCT No.: PCT/EP2022/064879  
§ 371 (c)(1),  
(2) Date: Feb. 8, 2024

(87) PCT Pub. No.: WO2023/030708  
PCT Pub. Date: Mar. 9, 2023

(65) Prior Publication Data  
US 2025/0130288 A1      Apr. 24, 2025

(30) Foreign Application Priority Data

Aug. 31, 2021      (DE) ..................... 10 2021 209 542.9

(51) Int. Cl.  
*G01R 31/396* (2019.01)  
*B60L 58/12* (2019.01)  
(Continued)

(52) U.S. Cl.  
CPC ............ *G01R 31/396* (2019.01); *B60L 58/12* (2019.02); *G01R 31/3842* (2019.01);  
(Continued)

(58) Field of Classification Search  
CPC .............. G01R 31/396; G01R 31/3842; G01R 31/389; G01R 31/367; G01R 31/3828;  
(Continued)

(56) References Cited

U.S. PATENT DOCUMENTS

2007/0299620 A1      12/2007   Yun et al.  
2010/0321025 A1      12/2010   Lin et al.  
(Continued)

FOREIGN PATENT DOCUMENTS

DE      102010019128 A1      11/2011  
DE      102013220918 A1      4/2015  
(Continued)

OTHER PUBLICATIONS

M. Garmendia, I. Gandiaga, G. Perez, U. Viscarret and I. Etxeberria-Otadui, "Proposal and validation of a SOC estimation algorithm of LiFePO4 battery packs for traction applications," 2013 World Electric Vehicle Symposium and Exhibition (EVS27), Barcelona, Spain, 2013, pp. 1-11 (Year: 2013).*  
(Continued)

*Primary Examiner* — Daniel R Miller  
(74) *Attorney, Agent, or Firm* — Michael Best & Friedrich LLP

(57) ABSTRACT

The invention relates to a method for determining the state of charge of an electric energy store comprising electric energy store cells and a sensor, in which method: in a first  
(Continued)

method step, operating parameters of the electric energy store are determined; in a second method step, a maximum state of charge and a minimum state of charge are determined as a temporal integral for each electric energy store cell on the basis of a current (I), a current measuring inaccuracy ($\Delta I$), a capacity, a correction value for the minimum state of charge, and a correction value for the maximum state of charge of the electric energy store cells; the correction value for the minimum state of charge is determined by means of a minimum state of charge on the basis of a filtered minimum open-circuit voltage of the electric energy store; the correction value for the maximum state of charge is determined by means of a maximum state of charge on the basis of a filtered maximum open-circuit voltage of the electric energy store; wherein a maximum state of charge ($SOC_{max}$) of the electric energy store is the maximum of the maximum states of charge of all the electric energy store cells, and a minimum state of charge ($SOC_{min}$) of the electric energy store is the minimum of the minimum states of charge of all the electric energy store cells.

11 Claims, 3 Drawing Sheets

(51) Int. Cl.
  *G01R 31/3842*  (2019.01)
  *G01R 31/389*  (2019.01)
  *H01M 10/48*  (2006.01)

(52) U.S. Cl.
  CPC ........ *G01R 31/389* (2019.01); *H01M 10/482* (2013.01); *H01M 2220/20* (2013.01)

(58) Field of Classification Search
  CPC ................. B60L 58/12; H01M 10/482; H01M 2220/20
  See application file for complete search history.

(56) References Cited

U.S. PATENT DOCUMENTS

| | | | |
|---|---|---|---|
| 2012/0310563 A1* | 12/2012 | Shigemizu ......... | G01R 31/3828 |
| | | | 702/63 |
| 2014/0333317 A1 | 11/2014 | Frost et al. | |
| 2015/0056479 A1* | 2/2015 | Poehler ................. | H01M 50/51 |
| | | | 429/50 |
| 2021/0190867 A1 | 6/2021 | Fan et al. | |

FOREIGN PATENT DOCUMENTS

| | | |
|---|---|---|
| DE | 102017211496 B3 | 2/2019 |
| EP | 2787361 A1 | 10/2014 |
| EP | 3650265 A1 | 5/2020 |
| GB | 2478557 A | 9/2011 |
| WO | 2015132544 A1 | 9/2015 |

OTHER PUBLICATIONS

Translation of International Search Report for Application No. PCT/EP2022/064879 dated Sep. 22, 2022 (2 pages).

* cited by examiner

METHOD FOR DETERMINING A STATE OF CHARGE OF AN ELECTRIC ENERGY STORE, ELECTRIC ENERGY STORE, AND DEVICE

BACKGROUND

The present invention relates to a method for determining a state of charge of an electric energy store, an electric energy store, and a device.

US 2010/0321025 A1 discloses a method for use with a vehicle battery stack having a number of individual battery cells.

US 2007/0299620 A1 discloses a method for determining the state of charge of a battery, a battery management system, and an operating method for this purpose.

US 2014/0333317 A1 discloses a battery state estimator combining an electrochemical solid state concentration model with an empirical replacement circuit model.

SUMMARY

The core of the invention in the method for determining a state of charge of an electric energy store comprising electric energy store cells and at least one sensor is that, in a first method step, operating parameters of the electric energy store are determined, wherein, in a second method step, at least one maximum state of charge and at least one minimum state of charge are determined as a temporal integral for each electric energy store cell on the basis of a current, a current measuring inaccuracy, at least one capacity, a correction value for the minimum state of charge and a correction value for the maximum state of charge of the electric energy store cells, wherein the correction value for the minimum state of charge is determined by a minimum state of charge on the basis of a filtered minimum open-circuit voltage of the electric energy store, wherein the correction value for the maximum state of charge is determined by a maximum state of charge on the basis of a filtered maximum open-circuit voltage of the electric energy store, wherein a maximum state of charge of the electric energy store is the maximum of the maximum states of charge of all the electric energy store cells, and a minimum state of charge of the electric energy store is the minimum of the minimum states of charge of all the electric energy store cells.

The background of the invention is that, when determining the state of charge during operation of the electric energy store by means of power integration, large deviations can occur due to measuring errors, especially in the case of longer operating times. By means of the method according to the invention, these deviations are reduced, so that an accurate estimation of the state of charge is made possible. For example, the remaining range of an electrically driven vehicle can thus be estimated more accurately, or the remaining number of startup operations of an internal combustion engine can be estimated more accurately.

Advantageously, the averaged current state of charge of the electric energy store during operation of the electric energy store remains within an interval between the minimum state of charge and the maximum state of charge of the electric energy store.

According to one advantageous embodiment, in the second method step, two minimum states of charge and two maximum states of charge are determined for each electric energy store cell, wherein in particular, in order to determine first maximum states of charge, a capacity at the beginning of the service life of the electric energy store cells is used, and, in order to determine second maximum states of charge, a capacity at the end of the service life of the electric energy store cells is used, and wherein, in order to determine first minimum states of charge, the capacity at the beginning of the service life of the electric energy store cells is used and, in order to determine second minimum states of charge, the capacity at the end of the service life of the electric energy store cells is used. The accuracy in determining the state of charge of the electric energy store is further improved as a result.

It is in this context advantageous when, in the second method step for determining the maximum states of charge of each electric energy store cell, the sum of the current measuring inaccuracy and the current is multiplied by the reciprocal capacity of each electric energy store cell at the beginning of its service life, respectively by the reciprocal capacity of each electric energy store cell at the end of its service life, and the correction value of the maximum state of charge is added in each case, wherein, in order to determine the minimum states of charge of each electric energy store cell, the difference between the current and the current measuring inaccuracy is multiplied by the reciprocal capacity of each electric energy store cell at the beginning of its service life, respectively by the reciprocal capacity of each electric energy store cell at the end of its service life, and the correction value of the minimum state of charge is added in each case. By means of the capacities at the beginning and at the end of the service life of the electric energy store cells, limit values for the minimum and maximum states of charge of the electric energy store cells can be estimated during the service life.

It is further advantageous when, in a third method step, the maximum state of charge is determined on the basis of the filtered maximum open-circuit voltage of the electric energy store cells and the minimum state of charge is determined on the basis of the filtered minimum open-circuit voltage of the electric energy store cells, wherein, in a fourth method step for determining or correcting the correction value for the maximum state of charge, the difference is formed from the maximum states of charge of the electric energy store cells and the maximum state of charge on the basis of the filtered maximum open-circuit voltage of the electric energy store cells, and wherein, in order to determine or correct the correction value for the minimum state of charge, the difference is formed from the minimum states of charge of the electric energy store cells and the minimum state of charge on the basis of the filtered minimum open-circuit voltage of the electric energy store. The correction values are able to be determined with high accuracy as a result.

Advantageously, an electrochemical battery model is used in this case.

It is in this context advantageous when, in the fourth method step for determining or correcting the respective correction value, the difference between the maximum states of charge of the electric energy store cells and the maximum state of charge on the basis of the filtered maximum open-circuit voltage of the electric energy store cells is multiplied by a correction factor, and the difference between the minimum states of charge of the electric energy store cells and the minimum state of charge on the basis of the filtered minimum open-circuit voltage of the electric energy store is multiplied by a correction factor. Accuracy is further improved as a result.

Advantageously, in order to determine the maximum open-circuit voltage of the electric energy store cells, a difference is formed between the current and the current measuring inaccuracy and, on the basis of the temperature of the electric energy store, an ohmic resistance, a charging transfer resistance, and a diffusion resistance at the beginning of the service life of the electric energy store cell are determined, wherein a first product is formed from the sum of the ohmic resistance and the charging transfer resistance and the difference between the current and the current measuring inaccuracy, wherein the diffusion resistance is multiplied by the difference between current and the current measuring inaccuracy and then filtered by a first low-pass filter and added to the first product, wherein this sum is multiplied by a sum of the cell voltage and the cell voltage measuring inaccuracy of each electric energy store cell, and the filtered maximum open-circuit voltage of the electric energy store cells is determined therefrom by means of a second low-pass filter.

It is further advantageous when, in order to determine the minimum open-circuit voltage of the electric energy store cells, a sum of the current and the current measuring inaccuracy is formed and, on the basis of the temperature of the electric energy store, an ohmic resistance, a charging transfer resistance, and a diffusion resistance at the end of the service life of the electric energy store cell are determined, wherein a second product is formed from the sum of the ohmic resistance and the charging transfer resistance and the sum of the current and the current measuring inaccuracy, wherein the diffusion resistance is multiplied by the sum of the current and the current measuring inaccuracy and then filtered by a third low-pass filter and added to the second product, wherein this sum is multiplied by a difference between the cell voltage and the cell voltage measuring inaccuracy of each electric energy store cell, and the filtered maximum open-circuit voltage of the electric energy store cells is determined therefrom by means of a fourth low-pass filter.

Advantageously, the maximum state of charge on the basis of the filtered maximum open-circuit voltage of the electric energy store cells is the maximum of all state of charge curves of the electric energy store cells, and/or that the minimum state of charge on the basis of the filtered minimum open-circuit voltage of the electric energy store cells is the minimum of all state of charge curves of the electric energy store cells. As a result, all electric energy store cells are considered in order to determine the maximum or minimum state of charge on the basis of the filtered open-circuit voltages.

It is further advantageous when the first and/or second method steps are performed during operation of the electric energy store, and/or the third and/or fourth method steps are performed when the electric energy store is not in operation. It is in this context advantageous when, during operation of the electric energy store, the state of charge can be determined with high accuracy. After operation, the third and/or fourth method steps can be performed so that the correction values are continuously adjusted and improved.

The core of the invention in the electric energy store is that a state of charge of the electric energy store can be determined by means of a method as described hereinabove.

The background of the invention is that, when determining the state of charge during operation of the electric energy store by means of power integration, large deviations can occur due to measuring errors, especially in the case of longer operating times. In the electric energy store according to the invention, these deviations are reduced, so that an accurate estimation of the state of charge is made possible.

The core of the invention in the device, in particular the vehicle, is that the device comprises an electric energy store as described hereinabove.

The background of the invention is that the remaining range of an electrically driven vehicle can be estimated more accurately, or the remaining number of startup operations of an internal combustion engine can be estimated more accurately.

The preceding embodiments and further developments can be combined with one another as desired, to the extent that they are advantageous. Further possible embodiments, developments, and implementations of the invention also include feature combinations of the invention not explicitly specified as described hereinabove or hereinafter with respect to exemplary embodiments. In particular, a skilled person will in this context also add individual aspects as improvements or enhancements to the respective basic design of the present invention.

BRIEF DESCRIPTION OF THE DRAWINGS

In the following section, the invention is explained on the basis of exemplary embodiments, based on which further inventive features may arise, to which the scope of the invention is however not limited. The exemplary embodiments of the invention are illustrated in the drawings. Shown are.

and

Figure 4:
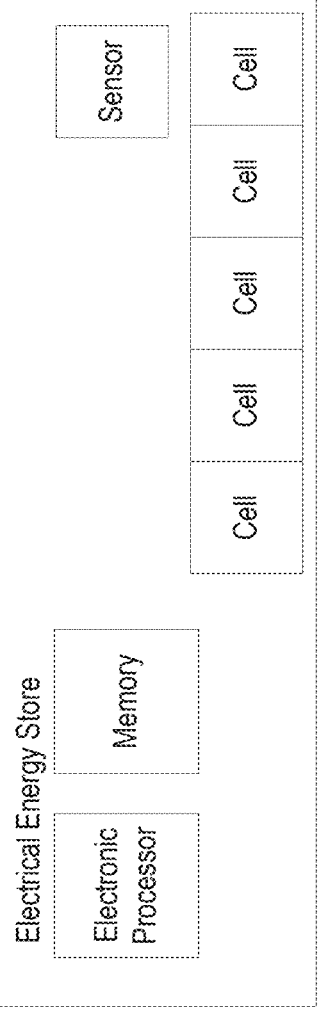

FIG. 4 is an example illustrating an electric energy store according to exemplary embodiments provided herein.

DETAILED DESCRIPTION

Figure 1:
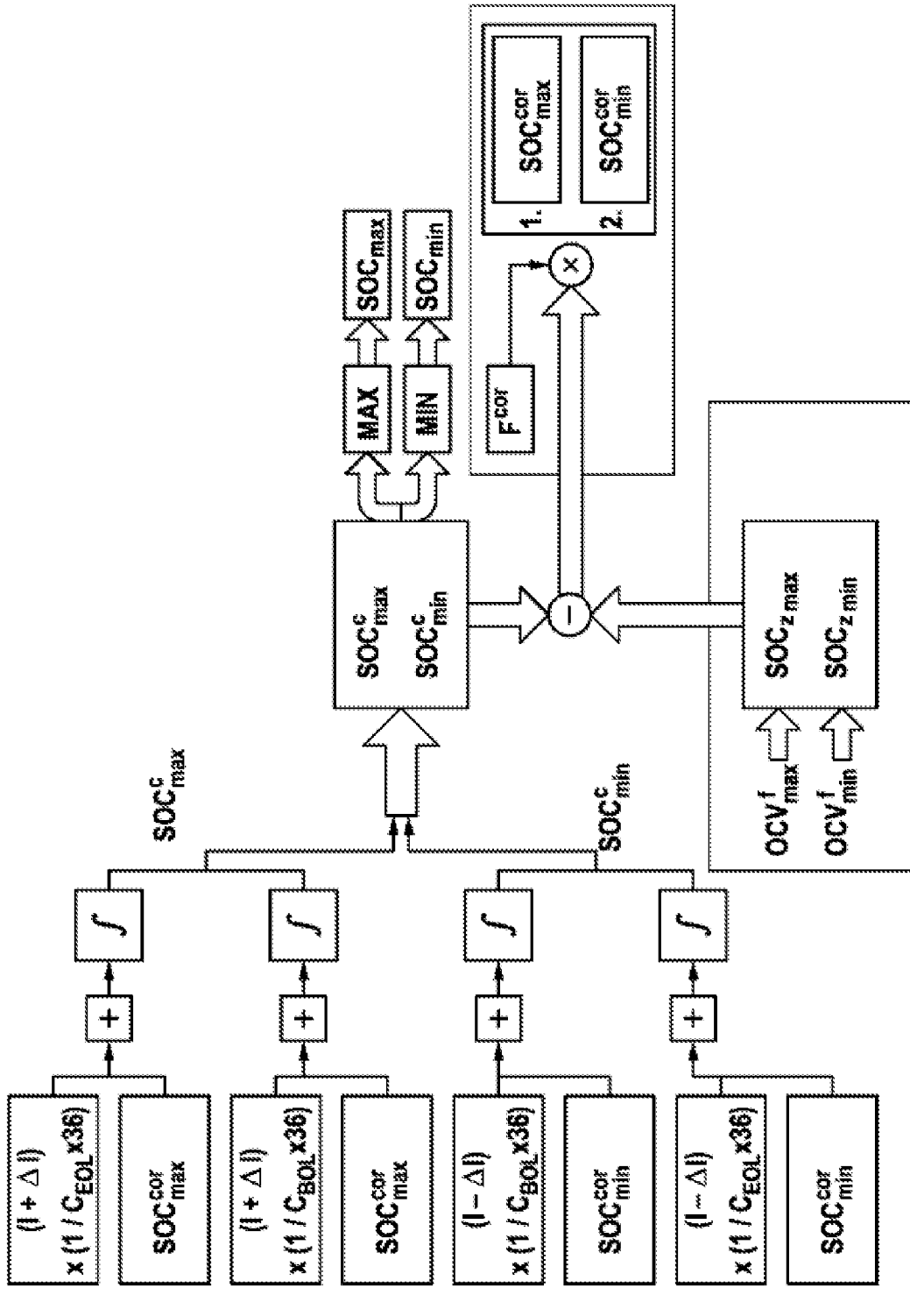
FIG. 1 a schematic flow diagram of a method according to the invention for determining a state of charge of an electric energy store.

FIG. 1 shows a schematic flow diagram of the method according to the invention for determining a state of charge of an electric energy store, comprising a plurality of electric energy store cells and at least one sensor, in particular a current sensor, a voltage sensor, and a temperature sensor.

Preferably, the electric energy store cells are arranged in series, each electric energy store cell comprising its own voltage sensor and the electric energy store comprising a single current sensor and temperature sensor.

Alternatively, multiple temperature sensors can also be arranged in the electric energy store and/or each electric energy store cell or subsets of the electric energy store cells can each comprise a current sensor and/or a temperature sensor.

In a first method step of the method, a current I through the electric energy store cells, a temperature T, a current measuring inaccuracy $\Delta I$, a cell voltage $U^C$ of each electric energy store cell, a cell voltage measuring inaccuracy $\Delta U^C$, a capacity of each electric energy store cell at the beginning of its service life $C_{BOL}$, and a capacity of each electric energy store cell at the end of its service life $C_{EOL}$ are determined as operating parameters of the electric energy store.

The aforementioned parameters are in this case partially measured by means of sensors, e.g., the temperature and/or the current I and/or the cell voltage $U^C$. The aforementioned parameters are partially read from a storage means of the electric energy store and/or from a table and/or data sheet of the electric energy store cells, e.g., the current measuring inaccuracy $\Delta I$, the cell voltage measuring inaccuracy $\Delta U^C$, the capacity of each electric energy store cell at the beginning of its service life $C_{BOL}$, and the capacity of each electric energy store cell at the end of its service life $C_{EOL}$.

In a second method step, in order to determine a maximum state of charge of each electric energy store cell $$SOC_{max}^C,$$

the sum of the current measuring inaccuracy $\Delta I$ and the current I is multiplied by the reciprocal capacity of each electric energy store cell at the beginning of its service life $C_{BOL}$, and a correction value for the maximum state of charge $$SOC_{max}^{cor}$$

is added. This sum is integrated over time for each electric energy store cell. In addition, the sum of the current measuring inaccuracy $\Delta I$ and the current I is multiplied by the reciprocal capacity of each electric energy store cell at the end of its service life $C_{EOL}$, and the correction value for the maximum state of charge $$SOC_{max}^{cor}$$

is added. This sum is also integrated over time for each electric energy store cell. As a result, two values are obtained for the maximum state of charge $$SOC_{max}^{cor}$$

of each electric energy store cell. The maximum state of charge $SOC_{max}$ of the entire electric energy store corresponds to the maximum of all maximum states of charge $$SOC_{max}^C$$

of the electric energy store cells.

Furthermore, in order to determine a minimum state of charge of each electric energy store cell $$SOC_{min}^C,$$

the difference between the current I and the current measuring inaccuracy $\Delta I$ is multiplied by the reciprocal capacity of each electric energy store cell at the beginning of its service life $C_{BOL}$, and a correction value for the minimum state of charge $$SOC_{min}^{cor}$$

is added. This sum is integrated over time for each electric energy store cell. In addition, the difference between the current I and the current measuring inaccuracy $\Delta I$ is multiplied by the reciprocal capacity of each electric energy store cell at the end of its service life $C_{EOL}$, and the correction value for the minimum state of charge $$SOC_{min}^{cor}$$

is added. This sum is integrated over time for each electric energy store cell. As a result, two values are obtained for the minimum state of charge $$SOC_{min}^C$$

of each electric energy store cell. The minimum state of charge $SOC_{min}$ of the entire electric energy store corresponds to the minimum of all minimum states of charge $$SOC_{min}^C$$

of the electric energy store cells.

In a third method step, the maximum state of charge $SOC_{z_{max}}$ is determined on the basis of the filtered maximum open-circuit voltage $$OCV_{max}^f$$

of the electric energy store cells, in particular after the electric energy store has been switched off.

Furthermore, the minimum state of charge $SOC_{z_{min}}$ is determined on the basis of the filtered minimum open-circuit voltage $$OCV_{min}^f$$

of the electric energy store cells.

In a fourth method step for determining or correcting the correction value for the maximum state of charge $$SOC_{max}^{cor},$$

the difference is formed from the maximum states of charge $$SOC_{max}^{C}$$

of the electric energy store cells and the maximum state of charge $SOC_{z_{max}}$ on the basis of the filtered maximum open-circuit voltage $$OCV_{max}^{f}$$

of the electric energy store cells, and this difference is respectively multiplied by a correction factor $F^{cor}$.

In order to determine or correct the correction value for the minimum state of charge $$SOC_{min}^{cor},$$

the difference is formed from the minimum states of charge $$SOC_{min}^{C}$$

of the electric energy store cells and the minimum state of charge $SOC_{z_{min}}$ on the basis of the filtered minimum open-circuit voltage $$OCV_{min}^{f}$$

of the electric energy store, and this difference is respectively multiplied by a correction factor $F^{cor}$.

Figure 2:
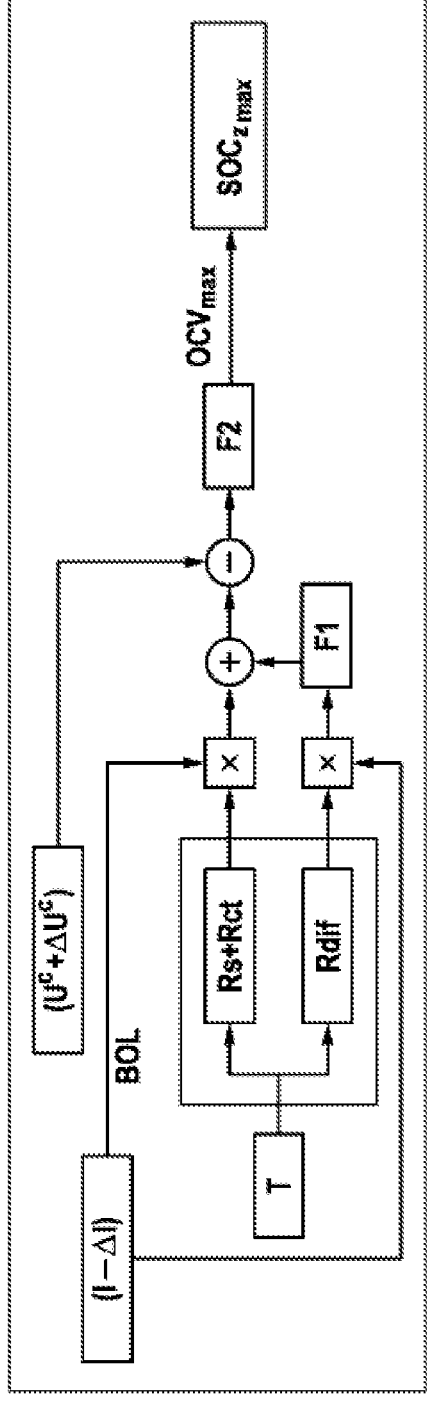
FIG. 2 a schematic flow diagram of method steps for determining a maximum state of charge $SOC_{z_{max}}$ of the electric energy store on the basis of a maximum open-circuit voltage $$OCV_{max}^f,$$

FIG. 2 shows method steps for determining the maximum state of charge $SOC_{z_{max}}$ on the basis of the filtered maximum open-circuit voltage $$OCV_{max}^{f}$$

of the electric energy store cells. Preferably, the maximum state of charge $SOC_{z_{max}}$ is determined on the basis of the filtered maximum open-circuit voltage $$OCV_{max}^{f}$$

of the electric energy store cells when the electric energy Vmax store is not in operation.

In order to determine the maximum open-circuit voltage $$OCV_{max}^{f}$$

of the electric energy store cells, the difference between the current I and the current measuring inaccuracy $\Delta I$ is formed. Based on the temperature T of the electric energy store, an ohmic resistance Rs, a charging transfer resistance Rct, and a diffusion resistance Rdif are determined at the beginning of the service life of the electric energy store cell, in particular from a table and/or a data sheet of the electric energy store cells.

A first product is formed from the sum of the ohmic resistance Rs and the charging transfer resistance Rct and the difference between the current I and the current measuring inaccuracy $\Delta I$. The diffusion resistance Rdif is likewise multiplied by the difference between the current I and the current measuring inaccuracy $\Delta I$ and then filtered by a first low-pass filter F1 and added to the first product. This sum is multiplied by a sum of the cell voltage $U^{C}$ and the cell voltage measuring inaccuracy $\Delta U^{C}$ for each electric energy store cell, and the filtered maximum open-circuit voltage $$OCV_{max}^{f}$$

of the electric energy store cells is determined therefrom by means of a second low-pass filter F2. Using a table, the maximum state of charge $SOC_{z_{max}}$ on the basis of the filtered maximum open-circuit voltage $$OCV_{max}^{f}$$

of the electric energy store cells is determined as the maximum of all state of charge curves.

Figure 3:
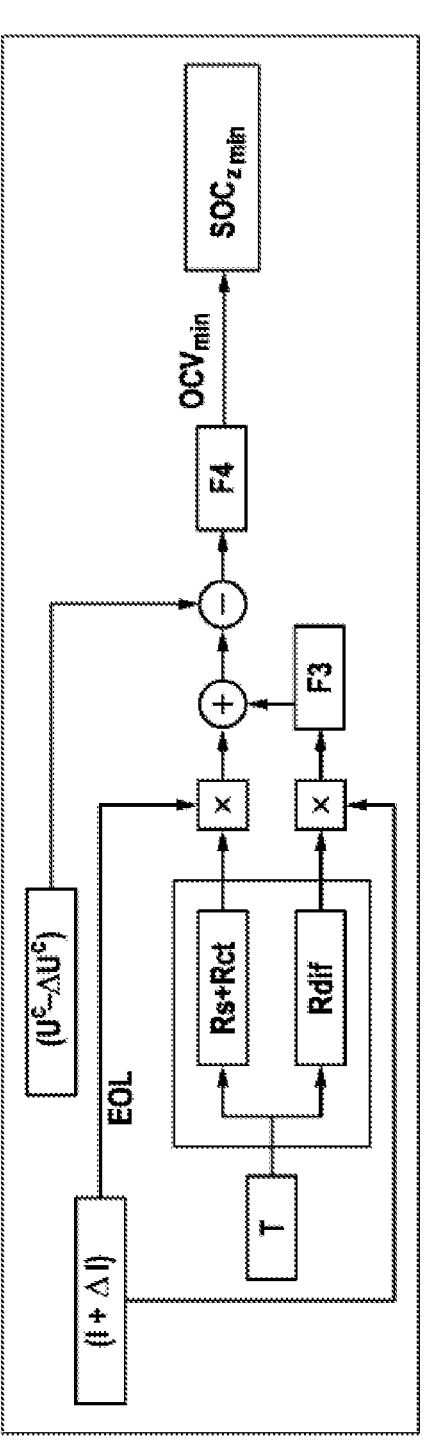
FIG. 3 a schematic flow diagram of method steps for determining a minimum state of charge $SOC_{z_{min}}$ of the electric energy store on the basis of a minimum open-circuit voltage $$OCV_{min}^f,$$

FIG. 3 shows method steps for determining the minimum state of charge $SOC_{z_{min}}$ on the basis of the filtered minimum open-circuit voltage $$OCV_{max}^{f}$$

of the electric energy store cells. Preferably, the minimum state of charge $SOC_{z_{min}}$ is determined on the basis of the filtered minimum open-circuit voltage $$OCV_{min}^{f}$$

of the electric energy store cells when the electric energy store is not in operation.

To determine the minimum open-circuit voltage $$OCV_{max}^{f}$$

of the electric energy store cells, the sum of the current I and the current measuring inaccuracy $\Delta I$ is formed. Based on the temperature T of the electric energy store, an ohmic resistance Rs, a charging transfer resistance Rct, and a diffusion resistance Rdif are determined at the end of the service life of the electric energy store cell, in particular from a table and/or a data sheet.

A second product is formed from the sum of the ohmic resistance Rs and the charging transfer resistance Rct and the sum of the current I and the current measuring inaccuracy ΔI. The diffusion resistance Rdif is likewise multiplied by the sum of current I and current measuring inaccuracy ΔI and then filtered by a third low-pass filter F3 and added to the second product. This sum is multiplied by a difference between the cell voltage $U^C$ and the cell voltage measuring inaccuracy $\Delta U^C$ for each electric energy store cell, and the filtered minimum open-circuit voltage $$OCV_{min}^f$$

of the electric energy store cells is determined therefrom by means of a fourth low-pass filter F4. Using a table, the minimum state of charge $SOC_{z_{min}}$ on the basis of the filtered minimum open-circuit voltage $$OCV_{min}^f$$

of the electric energy store cells is determined as the minimum of all state of charge curves.

In this context, an electric energy store is understood to mean a rechargeable energy store, in particular comprising an electrochemical energy store cell and/or an energy store module comprising at least one electrochemical energy store cell and/or an energy store pack comprising at least one energy store module. The energy store cell can be designed as a lithium-based battery cell, in particular a lithium-ion battery cell. Alternatively, the energy store cell is designed as a lithium polymer battery cell or a nickel-metal hydride battery cell or a lead-acid battery cell or a lithium air battery cell or a lithium sulfur battery cell.

A vehicle is understood to mean a land vehicle, e.g., a passenger vehicle or a haul truck, or an aircraft or a marine vehicle, in particular an at least semi-electrically driven vehicle. For example, the vehicle can be a battery-electrically driven vehicle having a purely electric drive, or a hybrid vehicle having an electric drive and an internal combustion engine.

The invention claimed is:

1. A method for operating an electric energy store comprising electric energy store cells and a sensor, the method comprising, in a first method step during operation of the electric energy store, determining operating parameters of the electric energy store, wherein the determined operating parameters include a current (I) of the electric energy store cells, a current measuring inaccuracy (ΔI) of the electric energy store cells, and a capacity of the electric energy store cells, wherein, in a second method step during operation of the electric energy store, a maximum state of charge is determined as a temporal integral for each electric energy store cell of the electric energy store on the basis of the determined operating parameters and a correction value for the maximum state of charge $$(SOC_{max}^{cor})_-$$

of the electric energy store cells, and a minimum state of charge is determined as a temporal integral for each electric energy store cell of the electric energy store on the basis of the determined operating parameters and a correction value for the minimum state of charge $$(SOC_{min}^{cor})$$

of the electric energy store cells, wherein the correction value for the minimum state of charge $$(SOC_{min}^{cor})$$

is determined based on a minimum state of charge $(SOC_{z_{min}})$ determined using a filtered minimum open-circuit voltage $$(OCV_{min}^f)$$

of the electric energy store, wherein the correction value for the maximum state of charge $$(SOC_{max}^{cor})$$

is determined based on a maximum state of charge $(SOC_{z_{max}})$ determined using a filtered maximum open-circuit voltage $$(OCV_{max}^f)$$

of the electric energy store, wherein a maximum state of charge $(SOC_{max})$ of the electric energy store corresponds to a maximum of the maximum states of charge $$(SOC_{max}^C)$$

of all the electric energy store cells, and a minimum state of charge $(SOC_{min})$ of the electric energy store corresponds to a minimum of the minimum states of charge $$_-(SOC_{min}^C)_-$$

of all the electric energy store cells, and wherein in another step of the method, operation of the electric energy store is controlled according to the maximum state of charge ($SOC_{max}$) and the minimum state of charge ($SOC_{min}$).

2. The method according to claim 1, wherein, in the second method step, two minimum states of charge $$(SOC_{min}^C)_-$$

and two maximum states of charge $$_-(SOC_{max}^C)_-$$

are determined for each electric energy store cell, wherein, to determine first maximum states of charge $$_-(SOC_{max}^C)_-$$

a capacity (CBOL) at the beginning of the service life of the electric energy store cells is used and, to determine second maximum states of charge $$_-(SOC_{max}^C)$$

a capacity (CEOL) at the end of the service life of the electric energy store cells is used, and wherein, to determine first minimum states of charge $$_-(SOC_{min}^C)_-$$

the capacity (CBOL) at the beginning of the service life of the electric energy store cells is used and, in order to determine second minimum states of charge $$_-(SOC_{min}^C)$$

the capacity (CEOL) at the end of the service life of the electric energy store cells is used.

3. The method according to claim 2, wherein, in the second method step for determining the maximum states of charge of each electric energy store cell $$_-(SOC_{max}^C)_-$$

a first sum of the current measuring inaccuracy ($\Delta I$) and the current (I) is multiplied by a reciprocal capacity of each electric energy store cell at the beginning of its service life (CBOL), and the correction value of the maximum state of charge $$(SOC_{max}^{cor})$$

is added to the first sum, and a second sum of the current measuring inaccuracy ($\Delta I$) and the current (I) is multiplied by a reciprocal capacity of each electric energy store cell at the end of its service life (CEOL), and the correction value of the maximum state of charge $$(SOC_{max}^{cor})_-$$

is added to the second sum, wherein, to determine the minimum states of charge of each electric energy store cell $$_-(SOC_{min}^C)$$

a first difference between the current (I) and the current measuring inaccuracy ($\Delta I$) is multiplied by a reciprocal capacity of each electric energy store cell at the beginning of its service life (CBOL), and the correction value of the minimum state of charge $$(SOC_{min}^{cor})$$

is added to the first difference, and a second difference between the current (I) and the current measuring inaccuracy ($\Delta I$) is multiplied by a reciprocal capacity of each electric energy store cell at the end of its service life (CEOL), and the correction value of the minimum state of charge $$_-(SOC_{min}^{cor})_-$$

is added to the second difference.

4. The method according to claim 1, wherein, in a third method step, the maximum state of charge ($SOC_{z_{max}}$) is determined on the basis of the filtered maximum open-circuit voltage $$(OCV_{max}^f)_-$$

of the electric energy store cells, and the minimum state of charge ($SOC_{z_{min}}$) is determined on the basis of the filtered minimum open-circuit voltage $$(OCV_{min}^f)_-$$

of the electric energy store cells, wherein, in a fourth method step for determining or correcting the correction value for the maximum state of charge $$\_(SOC_{max}^{cor})\_$$

a difference is formed from the maximum states of charge $$\_(SOC_{max}^{C})\_$$

of the electric energy store cells and the maximum state of charge $$\_(SOC_{z_{max}})\_$$

on the basis of the filtered maximum open-circuit voltage $$(OCV_{max}^{f})\_$$

of the electric energy store cells, and wherein, in order to determine or correct the correction value for the minimum state of charge $$\_(SOC_{min}^{cor})\_$$

a difference is formed from the minimum states of charge $$\_(SOC_{max}^{C})\_$$

of the electric energy store cells and the minimum state of charge $(SOC_{z_{max}})$ on the basis of the filtered minimum open-circuit voltage $$(OCV_{min}^{f})\_$$

of the electric energy store.

5. The method according to claim 4, wherein, in the fourth method step for determining or correcting the respective correction value, the difference between the maximum states of charge $$\_(SOC_{max}^{C})\_$$

of the electric energy store cells and the maximum state of charge $(SOC_{z_{max}})$ on the basis of the filtered maximum open-circuit voltage $$\_(OCV_{max}^{f})\_$$

of the electric energy store cells is multiplied by a first correction factor (Fcor), and the difference between the minimum states of charge $$\_(SOC_{min}^{C})\_$$

of the electric energy store cells and the minimum state of charge $(SOC_{z_{min}})$ on the basis of the filtered minimum open-circuit voltage $$\_(OCV_{min}^{f})\_$$

of the electric energy store is multiplied by a second correction factor (Fcor).

6. The method according to claim 4, wherein, to determine the maximum open-circuit voltage $$(OCV_{max}^{f})\_$$

of the electric energy store cells, a difference is formed between the current (I) and the current measuring inaccuracy (ΔI) and, on the basis of a temperature (T) of the electric energy store, an ohmic resistance (Rs), a charging transfer resistance (Rct), and a diffusion resistance (Rdif) at the beginning of the service life of the electric energy store cell are determined, wherein a first product is formed from the sum of the ohmic resistance (Rs) and the charging transfer resistance (Rct) and the difference between the current (I) and the current measuring inaccuracy (ΔI), wherein the diffusion resistance (Rdif) is multiplied by the difference between the current (I) and the current measuring inaccuracy (ΔI) and then filtered by a first low-pass filter (F1) and added to the first product, wherein this sum is multiplied by a sum of a cell voltage (UC) and a cell voltage measuring inaccuracy (ΔUC) of each electric energy store cell, and the filtered maximum open-circuit voltage $$(OCV_{max}^{f})\_$$

of the electric energy store cells is determined therefrom by means of a second low-pass filter (F2).

7. The method according to claim 6, wherein the maximum state of charge $(SOC_{z_{max}})$ determined on the basis of the filtered maximum open-circuit voltage $$(OCV_{max}^{f})\_$$

of the electric energy store cells is the maximum of all state of charge curves of the electric energy store cells, 15                                                    16 and/or that the minimum state of charge $(SOC_{z_{min}})$ determined on the basis of the filtered minimum open-circuit voltage $$\left(OCV_{min}^{f}\right)_{-}$$

of the electric energy store cells is the minimum of all state of charge curves of the electric energy store cells.

8. The method according to claim 4, wherein, in order to determine the minimum open-circuit voltage $$\left(OCV_{min}^{f}\right)_{-}$$

of the electric energy store cells, a sum of the current (I) and the current measuring inaccuracy (ΔI) is formed and, on the basis of a temperature (T) of the electric energy store, an ohmic resistance (Rs), a charging transfer resistance (Rct), and a diffusion resistance (Rdif) at the end of the service life of the electric energy store cell are determined, wherein a second product is formed from the sum of the ohmic resistance (Rs) and the charging transfer resistance (Rct) and the sum of the current (I) and the current measuring inaccuracy (ΔI), wherein the diffusion resistance (Rdif) is multiplied by the sum of the current (I) and the current measuring inaccuracy (ΔI) and then filtered by a third low-pass filter (F3) and added to the second product, wherein this sum is multiplied by a difference between a cell voltage (UC) and a cell voltage measuring inaccuracy (ΔUC) of each electric energy store cell, and the filtered maximum open-circuit voltage $$\left(OCV_{max}^{f}\right)_{-}$$

of the electric energy store cells is determined therefrom by means of a fourth low-pass filter (F4).

9. The method according to claim 4, wherein the third and/or fourth method steps are performed when the electric energy store is not in operation.

10. An electric energy store comprising electric energy store cells, an electronic processor, a memory, and a sensor, wherein the electronic processor of the electric energy store is configured to determine, using the sensor and/or memory, operating parameters of the electric energy store, wherein the determined operating parameters include a current (I) of the electric energy store cells, a current measuring inaccuracy (ΔI) of the electric energy store cells, and a capacity of the electric energy store cells, determine a maximum state of charge as a temporal integral for each electric energy store cell of the electric energy store on the basis of the determined operating parameters and a correction value for the maximum state of charge $$\_(SOC_{max}^{cor})\_$$

of the electric energy store cells, determine a minimum state of charge as a temporal integral for each electric energy store cell of the electric energy store on the basis of the determined operating parameters and a correction value for the minimum state of charge $$(SOC_{min}^{cor})$$

of the electric energy store cells, wherein the correction value for the minimum state of charge $$\_(SOC_{min}^{cor})\_$$

is determined based on a minimum state of charge $(SOC_{z_{min}})$ determined using a filtered minimum open-circuit voltage $$\left(OCV_{min}^{f}\right)_{-}$$

of the electric energy store, wherein the correction value for the maximum state of charge $$\_(SOC_{max}^{cor})\_$$

is determined based on a maximum state of charge $(SOC_{z_{max}})$ determined using a filtered maximum open-circuit voltage $$\left(OCV_{min}^{f}\right)_{-}$$

of the electric energy store, wherein a maximum state of charge $(SOC_{max})$ of the electric energy store corresponds to a maximum of the maximum states of charge $$\_(SOC_{max}^{cor})$$

of all the electric energy store cells, and a minimum state of charge $(SOC_{max})$ of the electric energy store corresponds to a minimum of the minimum states of charge $$\_(SOC_{min}^{C})\_$$

of all the electric energy store cells, and control operation of the electric energy store according to the maximum state of charge $(SOC_{max})$ and the minimum state of charge $(SOC_{min})$.

11. A vehicle, comprising an electric energy store according to claim 10.

\*     \*     \*     \*     \*